(12) United States Patent
Lin et al.

(10) Patent No.: US 9,391,049 B2
(45) Date of Patent: Jul. 12, 2016

(54) MOLDING PACKAGE ASSEMBLY AND MOLDING MATERIAL

(71) Applicant: Industrial Technology Research Institute, Chutung, Hsinchu County (TW)

(72) Inventors: Yu-Min Lin, Chutung (TW); Chau-Jie Zhan, Chutung (TW)

(73) Assignee: Industrial Technology Research Institute, Chutung, Hsinchu County (TW)

( * ) Notice: Subject to any disclaimer, the term of this patent is extended or adjusted under 35 U.S.C. 154(b) by 0 days.

(21) Appl. No.: 14/561,546

(22) Filed: Dec. 5, 2014

(65) Prior Publication Data

US 2015/0187737 A1 Jul. 2, 2015

(30) Foreign Application Priority Data

Dec. 30, 2013 (TW) .............................. 102148974 A

(51) Int. Cl.
*H01L 23/495* (2006.01)
*H01L 25/065* (2006.01)
(Continued)

(52) U.S. Cl.
CPC ........ *H01L 25/0657* (2013.01); *H01L 23/3135* (2013.01); *H01L 23/49827* (2013.01); *H01L 23/562* (2013.01); *H01L 24/97* (2013.01); *H01L 25/50* (2013.01); *H01L 24/13* (2013.01); *H01L 24/14* (2013.01); *H01L 24/16* (2013.01);
(Continued)

(58) Field of Classification Search
CPC . H01L 25/0657; H01L 25/50; H01L 23/3135; H01L 24/97; H01L 23/562; H01L 23/49827; H01L 24/16; H01L 2224/14181; H01L 2224/16225; H01L 2924/18161; H01L 2224/32225; H01L 2224/04; Y10T 428/24149
USPC ......................................................... 257/666
See application file for complete search history.

(56) References Cited

U.S. PATENT DOCUMENTS 7,459,782 B1 12/2008 Li
7,589,390 B2 9/2009 Yao
(Continued)

FOREIGN PATENT DOCUMENTS

TW 200919653 A 5/2009
TW 201216424 A 4/2012

OTHER PUBLICATIONS

Brunnbauer et al., "An Embedded Device Technology Based on a Molded Reconfigured Wafer," IEEE Electronic Components and Technology Conference, pp. 547-551 (2006).
(Continued)

*Primary Examiner* — Phat X Cao
*Assistant Examiner* — Mohammad M Hoque
(74) *Attorney, Agent, or Firm* — McCarter & English, LLP; Yu Lu

(57) ABSTRACT

A molding package assembly is provided, which includes a substrate and first and second molding packages stacked on the substrate. Each of the first and second molding packages has a semiconductor element, an anti-warping structure disposed around a periphery of the semiconductor element, a molding material encapsulating the semiconductor element and the anti-warping structure, and a protection layer formed on the semiconductor element, the molding material and the anti-warping structure. The anti-warping structure facilitates to prevent warping of the molding package assembly during a molding process.

16 Claims, 9 Drawing Sheets

(51) Int. Cl.
*H01L 23/498* (2006.01)
*H01L 23/00* (2006.01)
*H01L 23/31* (2006.01)
*H01L 25/00* (2006.01)

(52) U.S. Cl.
CPC .......... *H01L24/32* (2013.01); *H01L 24/73* (2013.01); *H01L 24/92* (2013.01); *H01L 2224/0401* (2013.01); *H01L 2224/13025* (2013.01); *H01L 2224/14181* (2013.01); *H01L 2224/16145* (2013.01); *H01L 2224/16146* (2013.01); *H01L 2224/16225* (2013.01); *H01L 2224/16235* (2013.01); *H01L 2224/32225* (2013.01); *H01L 2224/73204* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06548* (2013.01); *H01L 2924/1461* (2013.01); *H01L 2924/15311* (2013.01); *H01L 2924/18161* (2013.01); *H01L 2924/3511* (2013.01); *H01L 2924/37001* (2013.01); *Y10T 428/24149* (2015.01)

(56) References Cited

U.S. PATENT DOCUMENTS

| | | | |
|---|---|---|---|
| 7,808,072 B2 | 10/2010 | Choi et al. | |
| 7,911,039 B2 | 3/2011 | Bauer et al. | |
| 7,965,497 B2 | 6/2011 | Kwon et al. | |
| 8,018,048 B2 | 9/2011 | Tamaki | |
| 8,217,501 B2 | 7/2012 | Kwon et al. | |
| 8,227,889 B2 | 7/2012 | Kuo | |
| 8,384,223 B2 | 2/2013 | Sim et al. | |
| 2004/0150118 A1* | 8/2004 | Honda | 257/778 |
| 2008/0284047 A1 | 11/2008 | Tosaya et al. | |
| 2009/0079090 A1* | 3/2009 | Pressel et al. | 257/777 |
| 2009/0212420 A1* | 8/2009 | Hedler et al. | 257/737 |
| 2012/0007229 A1* | 1/2012 | Bartley et al. | 257/712 |
| 2012/0025362 A1 | 2/2012 | Chandrasekaran et al. | |
| 2012/0074599 A1 | 3/2012 | Kim | |
| 2012/0127689 A1 | 5/2012 | McLellan et al. | |
| 2012/0299173 A1* | 11/2012 | Mohammed et al. | 257/686 |
| 2013/0200534 A1 | 8/2013 | Shiobara et al. | |
| 2014/0055967 A1* | 2/2014 | Sato | 361/761 |
| 2014/0084445 A1* | 3/2014 | Lin | 257/698 |
| 2014/0210083 A1* | 7/2014 | Zhao et al. | 257/738 |

OTHER PUBLICATIONS

Kao et al., "Development of Through Silicon Via (TSV) Interposer for Memory Module Flip Chip Package," IEEE Electronic Components and Technology Conference, pp. 1461-1466 (2012).
Kripesh et al., "Design and Development of a Multi-Die Embedeed Micro Wafer Level Package," IEEE Electronic Components and Technology Conference, pp. 1544-1549 (2008).
Kumar et al., "Wafer Level Embedding Technology for 3D Wafer Level Embedded Package," IEEE Electronic Components and Technology Conference, pp. 1289-1296 (2009).
Sharma et al., "Embedded Wafer Level Packages with Laterally Placed and Vertically Stacked Thin Dies," IEEE Electronic Components and Technology Conference, pp. 1537-1543 (2009).
TW 200919653 English abstract.
TW 201216424 English abstract.

* cited by examiner

US 9,391,049 B2

MOLDING PACKAGE ASSEMBLY AND MOLDING MATERIAL

CROSS-REFERENCE TO RELATED APPLICATIONS

This application claims foreign priority to under 35 U.S.C. §119(a) to Patent Application No. 102148974, filed on Dec. 30, 2013, in the Intellectual Property Office of Ministry of Economic Affairs, Republic of China (Taiwan, R.O.C.), the entire content of which Patent Application is incorporated herein by reference and made a part of this specification.

BACKGROUND OF THE INVENTION

1. Technical Field

The present disclosure relates to molding package assemblies and molding materials, and, more particularly, to an anti-warping molding material and a molding package assembly using the same.

2. Description of Related Art

In the field of electronic packaging, a molding process and a wafer thinning process are required after a chip on wafer (CoW) assembly.

Some factors such as chip height uniformity, chip distribution uniformity, hardness, rigidity, coefficient of thermal expansion and glass transition temperature of the molding material and chips, warpage of the wafer and warping uniformity influence the product yield.

It has been found that serious warping easily occurs to a molding package after a molding process and consequently vacuum suction cannot be effectively performed by a grinding machine during a subsequent grinding process. Even if vacuum suction can be performed by the grinding machine during the grinding process, edges of the wafer are easily exposed from the molding material after the grinding process. Therefore, during the thinning process, slight warping or chip distribution may adversely affect the thinning uniformity. Moreover, warping may reduce the product reliability.

Therefore, how to overcome the above-described drawbacks has become critical.

SUMMARY OF THE INVENTION

The present disclosure provides a molding package assembly, which comprises: a substrate having opposite first and second surfaces; a first molding package disposed on the first surface of the substrate, wherein the first molding package comprises: a plurality of first conductive elements disposed on the first surface of the substrate, a first semiconductor element electrically connected to the substrate through the first conductive elements, a first anti-warping structure disposed around a periphery of the first semiconductor element, a first molding material formed on the first surface of the substrate and encapsulating the first semiconductor element, the first conductive elements and the first anti-warping structure, and a first protection layer formed on the first semiconductor element, the first molding material and the first anti-warping structure; and a second molding package disposed on the first molding package, wherein the second molding package comprises: a plurality of second conductive elements disposed on the first semiconductor element, a second semiconductor element electrically connected to the first semiconductor element through the second conductive elements, a second anti-warping structure disposed around a periphery of the second semiconductor element, a second molding material formed on the first protection layer of the first molding package and encapsulating the second semiconductor element, the second conductive elements and the second anti-warping structure, and a second protection layer formed on the second semiconductor element, the second molding material and the second anti-warping structure. The molding package assembly further comprises a third molding package disposed on the second molding package. The third molding package comprises: a plurality of third conductive elements disposed on the second semiconductor element; a third semiconductor element electrically connected to the second semiconductor element through the third conductive elements; a third anti-warping structure disposed around a periphery of the third semiconductor element; and a third molding material formed on the second protection layer of the second molding package and encapsulating the third semiconductor element, the third conductive elements and the third anti-warping structure. The molding package assembly further comprises a plurality of fourth conductive elements disposed on the second surface of the substrate, and the substrate, the first semiconductor element and the second semiconductor element have their respective through-silicon vias.

The present disclosure further provides a molding material, which comprises: a body; and an anti-warping structure comprising a ring-shaped portion formed on an edge of the body, a grid portion formed on an inner side of the ring-shaped portion, and a plurality of connecting portions connected to the ring-shaped portion and the grid portion, thereby preventing warping of the molding material in a molding process.

The molding material comprises a first material layer and a second material layer stacked in parallel to each other. The first material layer has a particle size less than that of the second material layer. The anti-warping structure is made of a material harder than silicon.

BRIEF DESCRIPTION OF THE DRAWINGS

FIGS. 7A to 7E are schematic cross-sectional views showing a method for fabricating a molding package assembly according to the present disclosure, wherein

DETAILED DESCRIPTION OF PREFERRED EMBODIMENTS

Figure 1:
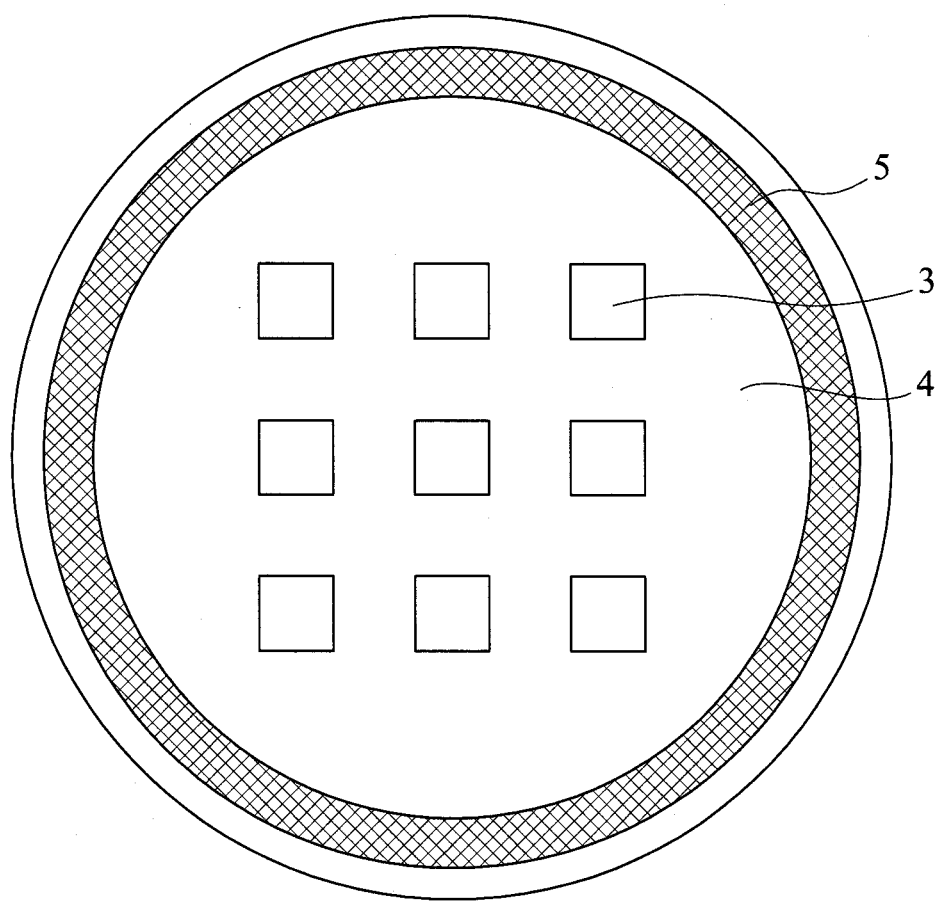
FIG. 1 is a schematic upper view of a molding package according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic upper view of a molding package according to a first embodiment of the present disclosure, and FIGS. 2A to 2D are schematic cross-sectional views showing a method for fabricating the molding package according to the first embodiment of the present disclosure. The molding package has a substrate 1, a semiconductor element 3, a molding material 4 and an anti-warping structure 5. In an embodiment, the substrate 1 has a rectangular periphery. In an embodiment, the semiconductor element 3 is a microelectromechanical system (MEMS).

The substrate 1 has a first surface 11. The semiconductor element 3 such as a chip is disposed on the first surface 11 of the substrate 1 through a plurality of conductive elements 2. An underfill (not shown) is formed between the semiconductor element 3 and the first surface 11 of the substrate 1.

The anti-warping structure 5 is substantially of a ring or rectangle shape and disposed on an edge of the molding material 4. The anti-warping structure 5 can be made of a material harder than silicon or the molding material 4. For example, the anti-warping structure 5 can be made of glass fiber, carbon fiber or a material added with a great amount of silicon filler.

Figure 2A:
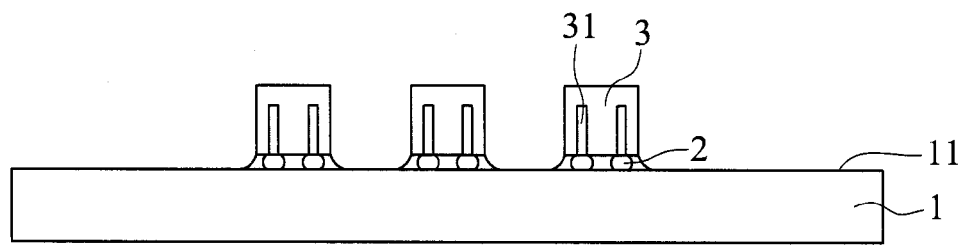
FIGS. 2A to 2D are schematic cross-sectional views showing a method for fabricating the molding package according to the first embodiment of the present disclosure.
Figure 2B:
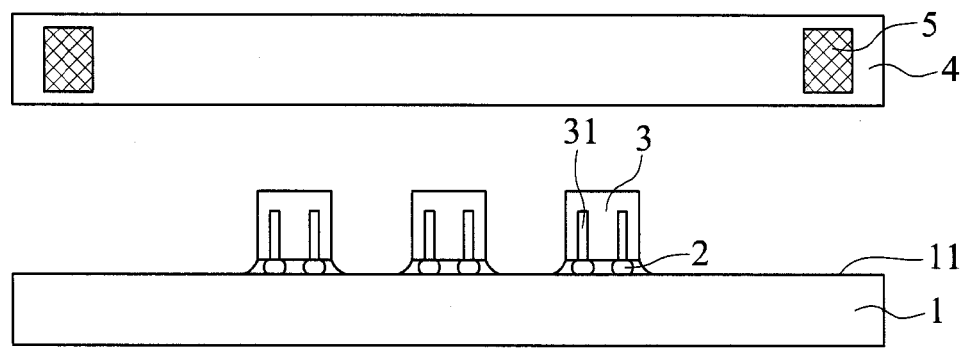
Figure 2C:
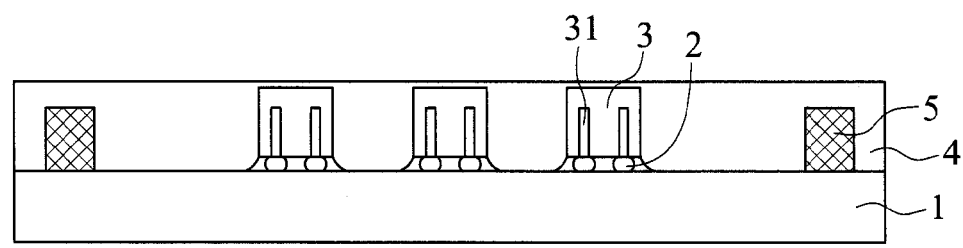
Figure 2D:
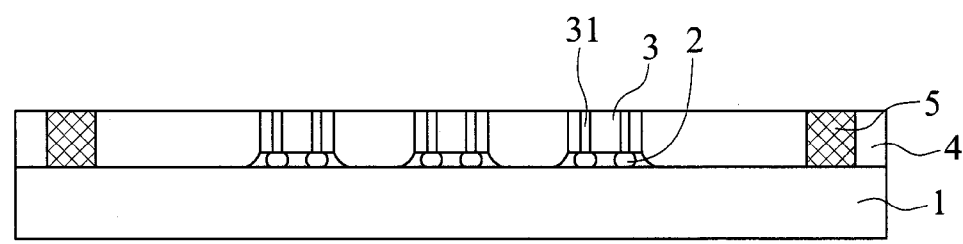

To fabricate the molding package, referring to FIG. 2A, the semiconductor element 3 is disposed on a first surface 11 of the substrate 1, and electrically connected to the substrate 1 through a plurality of conductive elements 2, and an underfill is formed between the semiconductor elements 3 and the substrate 1. The semiconductor element 3 has a plurality of through-silicon vias 31. Note that FIG. 2A is a schematic cross-sectional view of the molding package, and is not used to limit the number of the semiconductor element 3. Referring to FIG. 2B, a molding material 4 having an anti-warping structure 5 embedded therein is provided. The anti-warping structure 5 is disposed on an edge of the molding material 4 and is substantially of a ring shape. Referring to FIG. 2C, the molding material 4 having the anti-warping structure 5 embedded therein is laminated on the substrate 1 such that the semiconductor elements 3 is encapsulated by the molding material 4 and the anti-warping structure 5 is disposed around a periphery of the semiconductor elements 3. Referring to FIG. 2D, the molding material 4 is ground to expose the through-silicon vias 31 of the semiconductor elements 3.

In an embodiment, the anti-warping structure 5 is embedded in the molding material 4 to prevent warping of the molding package.

Figure 3:
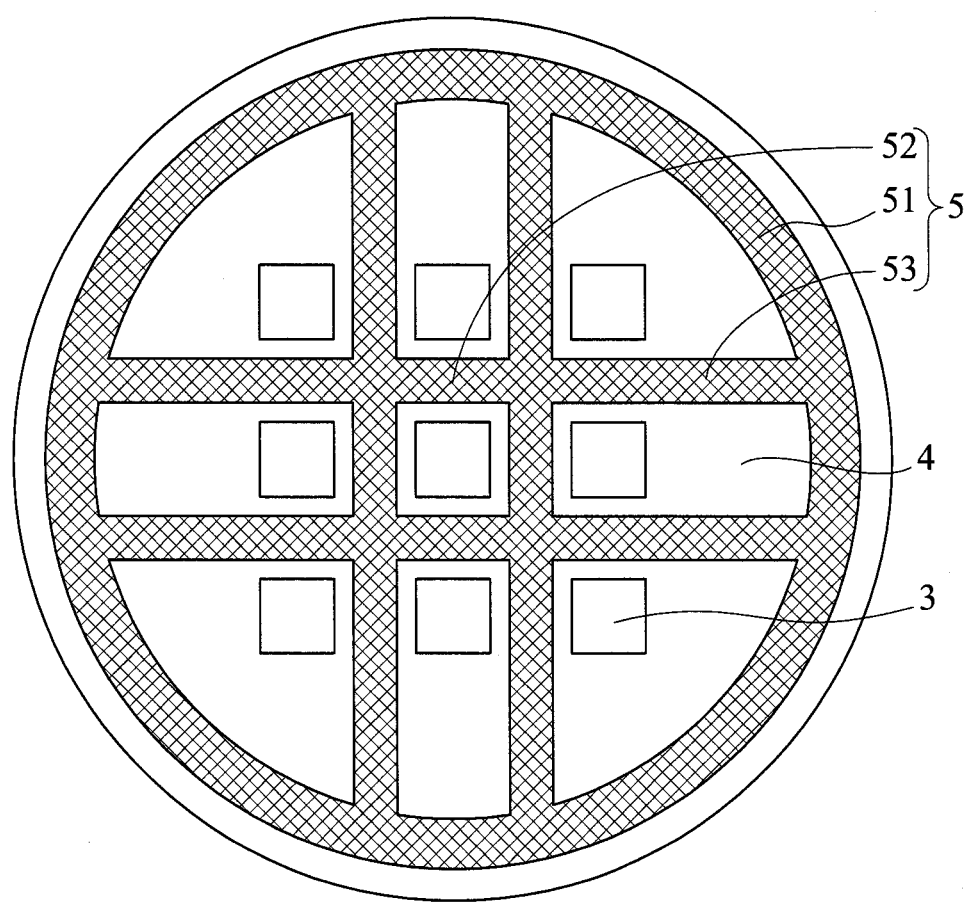
FIG. 3 is a schematic upper view of a molding package according to a second embodiment of the present disclosure.
Figure 4A:
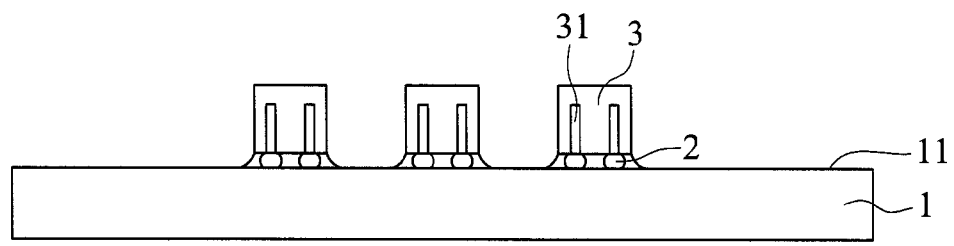
FIGS. 4A to 4D are schematic cross-sectional views showing a method for fabricating the molding package according to the second embodiment of the present disclosure.
Figure 4B:
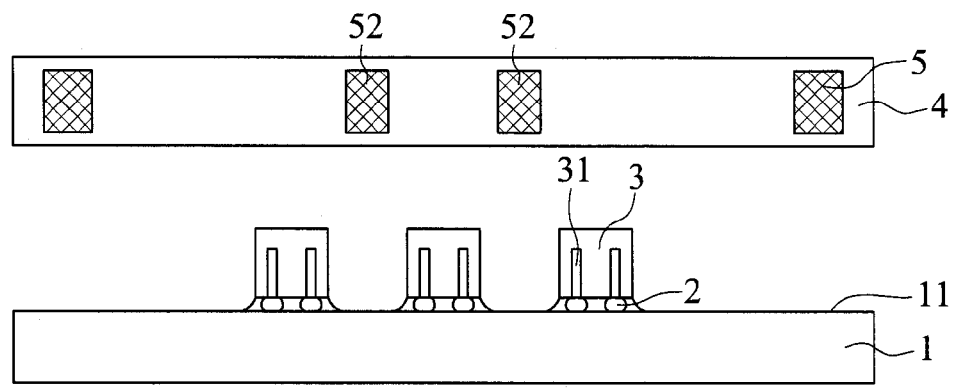
Figure 4C:
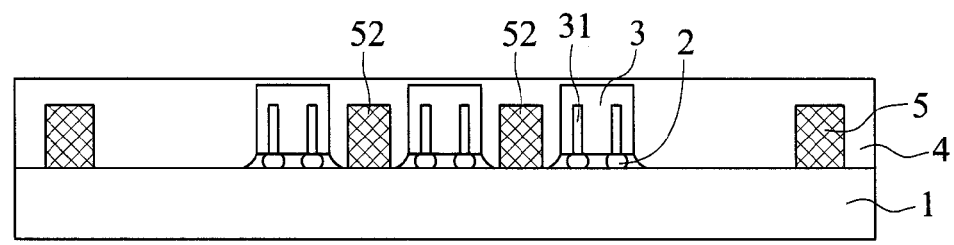
Figure 4D:
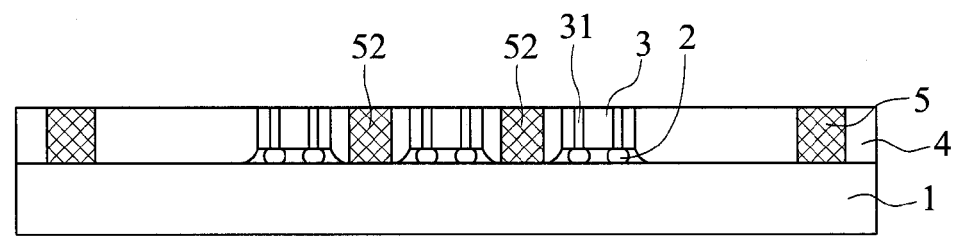

FIG. 3 is a schematic upper view of a molding package according to a second embodiment of the present disclosure, and FIGS. 4A to 4D are schematic cross-sectional views showing a method for fabricating the molding package according to the second embodiment of the present disclosure.

The second embodiment differs from the first embodiment in that in the second embodiment the anti-warping structure 5 has a first ring-shaped portion 51 disposed on an edge of the molding material 4, a second ring-shaped portion 52 disposed in the center of the molding material 4, and a connecting portion 53 connected to the first ring-shaped portion 51 and the second ring-shaped portion 52. Referring to FIG. 3, the molding package has, but is not limited to a plurality of semiconductor elements 3. The second ring-shaped portion 52 of the anti-warping structure 5 is disposed in the center of the molding material 4 and surrounds the semiconductor element 3 disposed in the center of the molding material 4. The first ring-shaped portion 51 is disposed on the edge of the molding material 4 and surrounds all of the semiconductor elements 3. The first ring-shaped portion 51 and the second ring-shaped portion 52 are connected through the connecting portion 53 so as to support the molding material 4 both in the center and on the edge, thereby preventing warping of the molding package. Also, the anti-warping structure 5 can be made of a material harder than silicon or the molding material 4. For example, the anti-warping structure 5 can be made of glass fiber, carbon fiber or a material added with silicon filler.

Since the method of FIGS. 4A to 4D is similar to the method of FIGS. 2A to 2D, detailed description thereof is omitted herein.

Figure 5A:
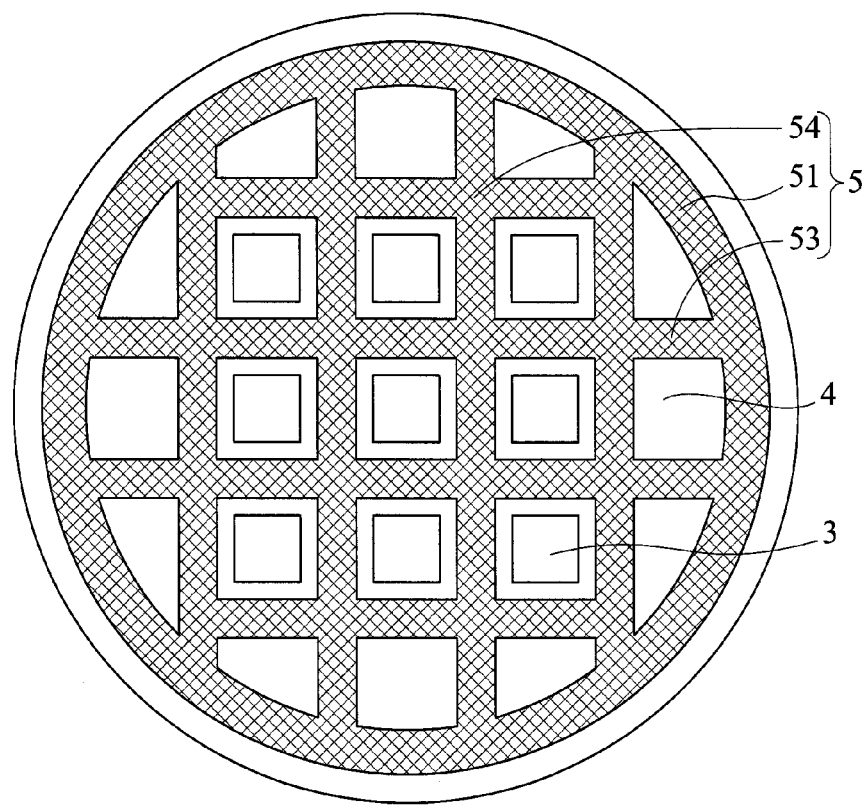
FIG. 5A is a schematic upper view of a molding package according to a third embodiment of the present disclosure.
Figure 5B:
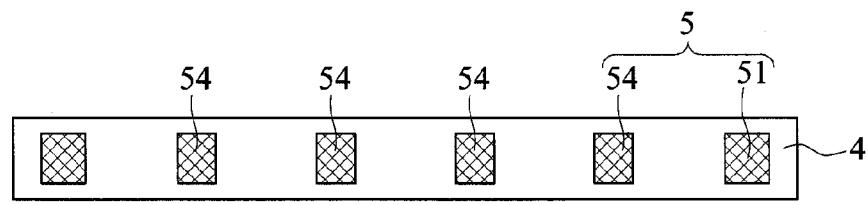
FIG. 5B is a schematic cross-sectional view of a molding material according to the present disclosure.
Figure 5C:
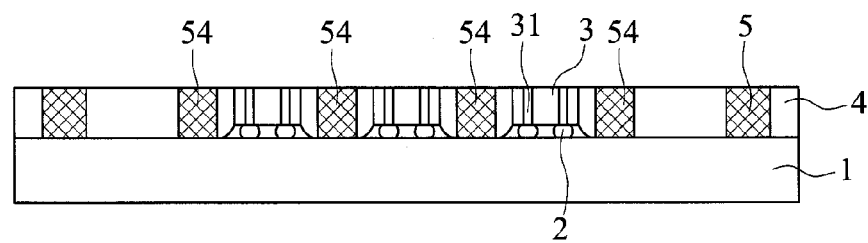
FIG. 5C is a schematic cross-sectional view of the molding package according to the third embodiment of the present disclosure.

FIG. 5A is a schematic upper view of a molding package according to a third embodiment of the present disclosure, FIG. 5B is a schematic cross-sectional view of a molding material of the present disclosure, and FIG. 5C is a schematic cross-sectional view of the molding package according to the third embodiment of the present disclosure.

Referring to FIGS. 5A to 5C, the third embodiment differs from the first embodiment in that in the third embodiment the anti-warping structure 5 has a first ring-shaped portion 51 disposed on an edge of the molding material 4, a grid portion 54 disposed on an inner side of the first ring-shaped portion 51, and a connecting portion 53 connected to the first ring-shaped portion 51 and the grid portion 54. As such, the grid portion 54 of the anti-warping structure 5 surrounds and is disposed among the semiconductor elements 3 that are arranged in an array on the substrate 1. Therefore, in an embodiment, each and every of the semiconductor elements 3 are surrounded by the anti-warping structure so as to prevent warping of the molding package.

Figure 6:
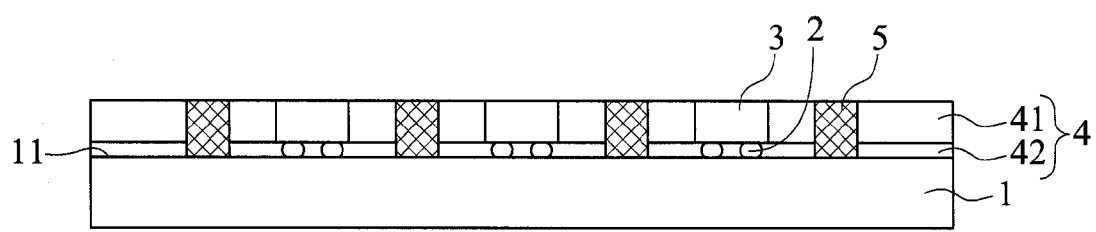
FIG. 6 is a schematic cross-sectional view of a molding package according to a fourth embodiment of the present disclosure.

FIG. 6 is a schematic cross-sectional view of a molding package according to a fourth embodiment of the present disclosure. The molding package has a substrate 1, a semiconductor element 3, a molding material 4, and an anti-warping structure 5.

The substrate 1 has a first surface 11. A plurality of conductive elements 2 are disposed on the first surface 11 of the substrate 1. The semiconductor element 3 such as a chip is disposed on the first surface 11 of the substrate 1 through the conductive elements 2.

The molding material 4 is formed on the first surface 11 of the substrate 1 and encapsulates the semiconductor elements 3. The molding material 4 has a first material layer 42 and a second material layer 41 staked in parallel to each other. The first material layer 42 is formed between the semiconductor element 3 and the substrate 1 and encapsulates the conductive elements 2. As shown in FIG. 6, the anti-warping structure 5 is embedded in the second material layer 41 and the first material layer 42. The second material layer 41 and the first material layer 42 can be made of same or different materials. If the second material layer 41 and the first material layer 42 are made of different materials, the second material layer 41 has a particle size greater than that of the first material layer 42, and the first material layer 42 can be made of a material similar to that of the substrate 1. If the second material layer 41 and the first material layer 42 are made of the same material, the second material layer 41 and the first material layer 42 can be formed sequentially or at the same time. For example, the second material layer 41 is formed between the semiconductor elements 3 and the substrate 1 and encapsulates the conductive elements 2 first, and then the second material layer 41 is formed on the first material layer 42 and encapsulates the semiconductor elements 3. In another embodiment, the molding material 4 having the first material layer 42 and the second material layer 41 is directly laminated on the substrate 1 and encapsulates the semiconductor elements 3 and the conductive elements 2.

The anti-warping structure 5 is disposed on an edge of the molding material 4 and is substantially of a ring shape. The anti-warping structure 5 can be made of a material harder than silicon or the molding material 4. For example, the anti-warping structure 5 can be made of glass fiber, carbon fiber or a material added with silicon filler. In an embodiment, the anti-warping structure 5 can have a ring shape of FIG. 1. Alternatively, the anti-warping structure 5 can have a first ring-shaped portion 51 disposed on an edge of the molding material 4, a second ring-shaped portion 52 disposed in the center of the molding material 4, and a connecting portion 53 connected to the first and second ring-shaped portions 51 and 52, as shown in FIG. 3. Alternatively, the anti-warping structure 5 can have a first ring-shaped portion 51 disposed on an edge of the molding material 4, a grid portion 54 disposed on an inner side of the first ring-shaped portion 51, and a connecting portion 53 connected to the first ring-shaped portion 51 and the grid portion 54, as shown in FIG. 5.

Therefore, the first material 42 of the molding material 4 can replace the underfill, the molding material 4 having the first material layer 42 and the second material 41 can be laminated on the substrate 1 directly, the second material 41 encapsulate the semiconductor elements 3, and the first material layer 42 of the molding material 4 is formed between the semiconductor elements 3 and the substrate 1 and encapsulates the conductive elements 2 and encapsulates the conductive elements 2. Accordingly, an underfill dispensing process is omitted.

FIGS. 7A to 7E are schematic cross-sectional views showing a method for fabricating a molding package assembly according to the present disclosure.

Figure 7A:
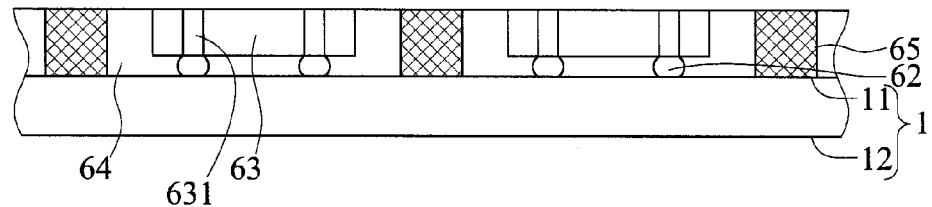

Referring to FIG. 7A, a plurality of first semiconductor elements 63 having through-silicon vias 631 are disposed on a first surface 11 of a substrate 1 and electrically connected to the substrate 1 through a plurality of first conductive elements 62. A first molding material 64 is formed on the first surface 11 of the substrate 1 and encapsulates the first semiconductor elements 63 and the first conductive elements 62. A first anti-warping structure 65 is embedded in the first molding material 64, and each of the first semiconductor elements 63 is surrounded by the first anti-warping structure 65. The substrate 1 can be a silicon substrate, an organic substrate or an interposer. The first molding material 64 and the first anti-warping structure 65 are similar to the molding material 4 and the anti-warping structure 5 of FIGS. 5A and 5B, respectively. In an embodiment, the semiconductor elements 63 are microelectromechanical systems (MEMS).

Figure 7B:
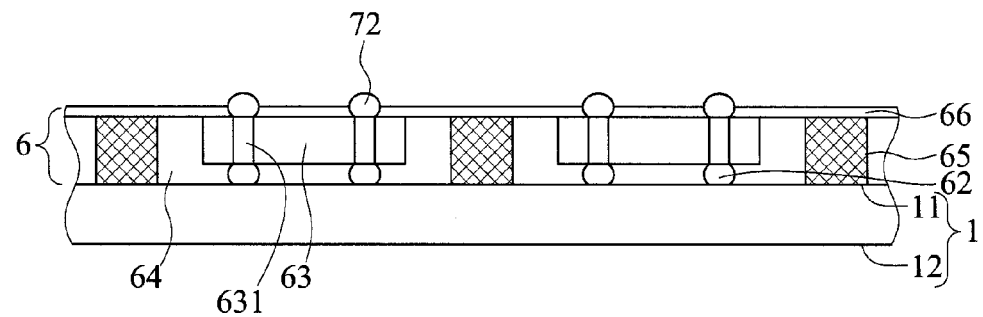

Referring to FIG. 7B, a first protection layer 66 is formed on the first semiconductor elements 63, the first molding material 64 and the first anti-warping structure 65. As such, the first semiconductor elements 63, the first molding material 64, the first anti-warping structure 65 and the first protection layer 66 form a first molding package 6. A plurality of openings (without denoted by reference numerals) are formed in the first protection layer 66 and corresponding in position to the through-silicon vias 631 of the first semiconductor elements 63, and a plurality of second conductive elements 72 are disposed in the openings and electrically connected to the through-silicon vias 631. A redistribution layer can be formed on the through-silicon vias 631 to change positions of openings thereof and the first conductive elements 62 according to the practical need.

Figure 7C:
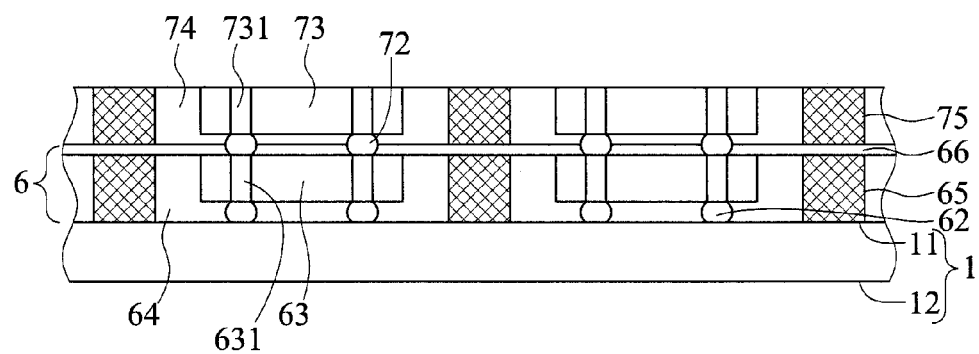
Figure 7D:
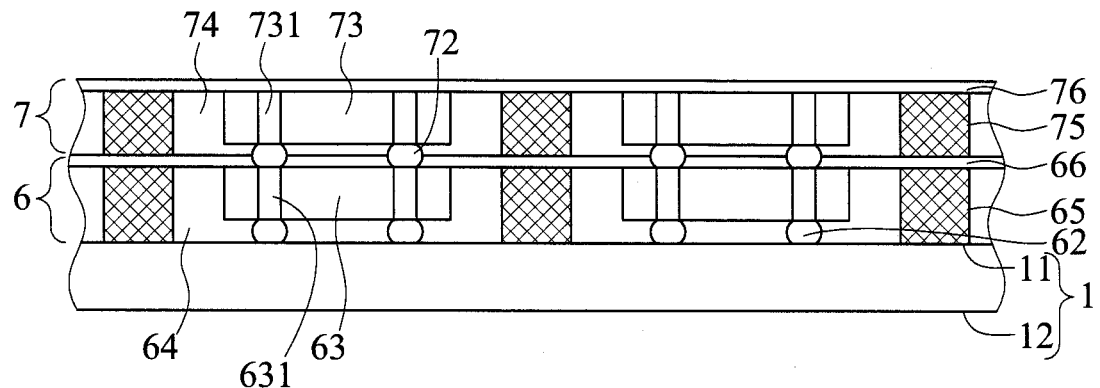

Referring to FIGS. 7C and 7D, a second molding package 7 is formed on the first molding package 6.

Referring to FIG. 7C, a plurality of second semiconductor elements 73 having a plurality of through-silicon vias 731 are disposed on and electrically connected to the first molding package 6 through the second conductive elements 72. A second molding material 74 having a second anti-warping structure 75 embedded therein is laminated on the first protection layer 66 and encapsulates the second semiconductor elements 73 and the second conductive elements 72. The second molding material 74 and the second anti-warping structure 75 are similar to the molding material 4 and the anti-warping structure 5 of FIGS. 5A and 5B. Therefore, when the second molding material 74 is laminated on the first molding package 6, each of the second semiconductor elements 73 is surrounded by the second anti-warping structure 75. Thereafter, referring to FIG. 7D, a second protection layer 76 is formed on the second semiconductor elements 73, the second molding material 74 and the second anti-warping structure 75. In addition, a redistribution layer can be formed on the through-silicon vias 731 to change positions of openings thereof and the second conductive elements 72 according to the practical need. In an embodiment, the second semiconductor elements 73 are microelectromechanical system (MEMS).

Figure 7E:
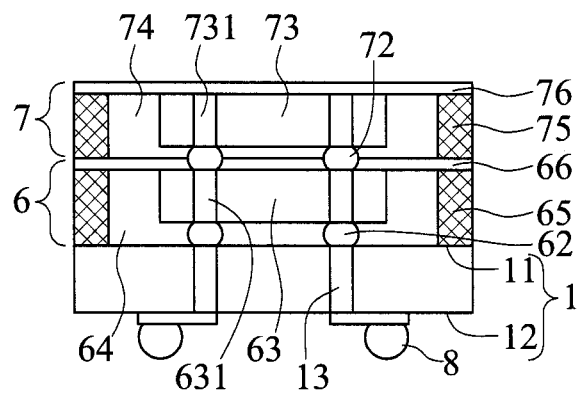

Then, a cutting process is performed to the structure of FIG. 7D to form a molding package assembly of FIG. 7E. The molding package assembly includes the substrate 1, the first molding package 6 and the second molding package 7. Further, a plurality of through-silicon vias 13 are formed in the substrate 1, and a plurality of fourth conductive elements 8 are disposed on a second surface 12 of the substrate 1 and electrically connected to the through-silicon vias 13.

Figure 7F:
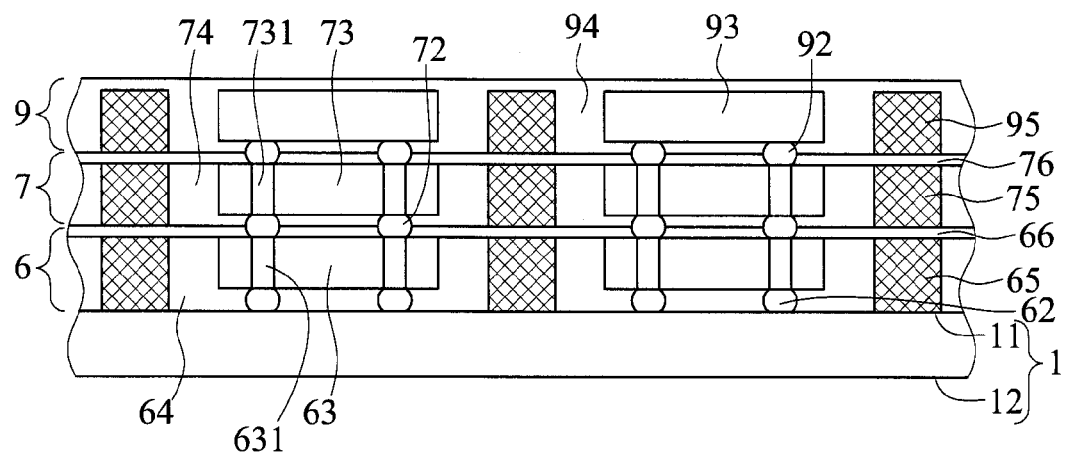
FIG. 7F shows a further embodiment of FIG. 7D.
Figure 7G:
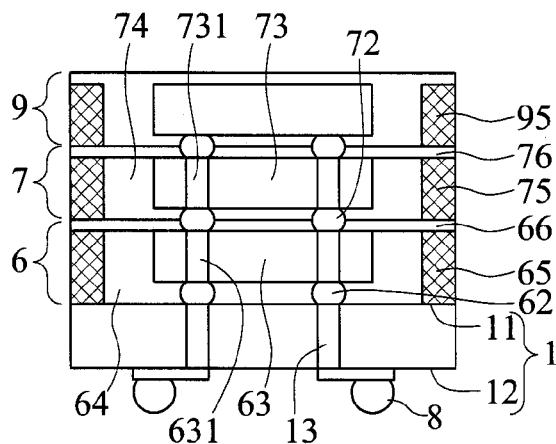
FIG. 7G shows a further embodiment of FIG. 7E.

Referring to FIG. 7F, a third molding package 9 is further disposed on the second protection layer 76 and electrically connected to the second molding package 7 through a plurality of third conductive elements 92. Finally, a cutting process is performed to the structure of FIG. 7F to form a molding package assembly of FIG. 7G As such, the molding package assembly includes the substrate 1, the first molding package 6, the second molding package 7 and the third molding package 9.

Referring to FIGS. 7A to 7G, a plurality of molding packages can be vertically stacked on the second molding package 7. If the molding package assembly includes a plurality of molding packages vertically stacked on the second molding package 7, the molding packages have the same structure as the first and second molding packages 6 and 7, except that the outermost molding package does not have a protection layer formed thereon and the semiconductor elements of the outermost molding package do not have through-silicon vias formed therein. For example, in FIGS. 7F and 7G if the molding package assembly includes the substrate 1, the first molding package 6, the second molding package 7 and the third molding package 9 only, the outermost third molding package 9 does not have a protection layer formed thereon and the third semiconductor elements 93 do not have through-silicon vias formed therein.

Similar to the molding material 4 of FIG. 6, the first molding material 64, the second molding material 74 or the third molding material 94 of FIGS. 7A to 7G can have two material layers stacked on one another. For example, the first molding material 64 can include a first material layer 42 formed between the first semiconductor element 63 and the substrate 1 and a second material layer 41 covering the first semiconductor elements 63 and the first material layer 42. The second molding material 74 can include a third material layer formed between the second semiconductor elements 73 and the first molding package 6 and a fourth material layer covering the second semiconductor elements 73 and the third material layer.

Therefore, the molding package assembly of the present disclosure includes a substrate and at least a molding package stacked thereon. The molding package has at least a semiconductor element, an anti-warping structure disposed around a periphery of the semiconductor element, a molding material encapsulating the semiconductor element and the anti-warping structure, and a protection layer formed on the semiconductor element, the molding material and the anti-warping structure. Further, the present disclosure provides a molding material having an anti-warping structure. The anti-warping structure has a first ring-shaped portion formed at an edge of the molding material, a grid portion formed at an inner side of the first ring-shaped portion and a plurality of connecting portions connecting the first ring-shaped portion and the grid portion. As such, the anti-warping structure provides a support force for the molding material so as to prevent warping of the substrate (wafer) during a molding process and facilitate a subsequent thinning process. Furthermore, the molding material can include two material layers stacked on one another. One of the material layers is formed between the semiconductor element (chip) and the substrate (wafer) so as to eliminate the need of an underfill and avoid an underfill dispensing process, thereby increasing the fabrication speed.

It will be apparent to those skilled in the art that various modifications and variations can be made to the disclosed embodiments. It is intended that the specification and examples be considered as exemplary only, with a true scope of the disclosure being indicated by the following claims and their equivalents.

The invention claimed is:

1. A molding package assembly, comprising:
    a substrate having opposite first and second surfaces;
    a first molding package disposed on the first surface of the substrate, the first molding package comprising:
        a plurality of first conductive elements disposed on and in direct contact with the first surface of the substrate;
        a first semiconductor element in direct contact with the first conductive elements and electrically connected to the substrate through the first conductive elements;
        a first anti-warping structure disposed around a periphery of the first semiconductor element;
        a first molding material formed on the first surface of the substrate and encapsulating the first semiconductor element, the first conductive elements and the first anti-warping structure; and
        a first protection layer formed on the first semiconductor element, the first molding material and the first anti-warping structure, wherein the first protection layer is composed of a non-conductive material; and
    a second molding package disposed on the first molding package, the second molding package comprising:
        a plurality of second conductive elements disposed on and in direct contact with the first semiconductor element;
        a second semiconductor element in direct contact with the second conductive elements and electrically connected to the first semiconductor element through the second conductive elements;
        a second anti-warping structure disposed around a periphery of the second semiconductor element;
        a second molding material formed on the first protection layer of the first molding package and encapsulating the second semiconductor element, the second conductive elements and the second anti-warping structure; and
        a second protection layer formed on the second semiconductor element, the second molding material and the second anti-warping structure, wherein the second protection layer is composed of a non-conductive material.

2. The molding package assembly of claim 1, further comprising a third molding package disposed on the second molding package, the third molding package comprising:
    a plurality of third conductive elements disposed on the second semiconductor element;
    a third semiconductor element electrically connected to the second semiconductor element through the third conductive elements;
    a third anti-warping structure disposed around a periphery of the third semiconductor element; and
    a third molding material formed on the second protection layer of the second molding package and encapsulating the third semiconductor element, the third conductive elements and the third anti-warping structure.

3. The molding package assembly of claim 2, further comprising a plurality of fourth conductive elements disposed on the second surface of the substrate, and a plurality of through-silicon vias formed in the first semiconductor element and the second semiconductor element, wherein the substrate is electrically connected to the fourth conductive elements through the through-silicon vias.

4. The molding package assembly of claim 2, further comprising a third protection layer formed on the third semiconductor element, the third molding material and the third anti-warping structure.

5. The molding package assembly of claim 1, wherein the first anti-warping structure and the second anti-warping structure are made of a material harder than silicon.

6. The molding package assembly of claim 1, wherein the first anti-warping structure and the second anti-warping structure are made of glass fiber, or a material added with silicon filler.

7. The molding package assembly of claim 1, wherein the substrate is a silicon substrate, an organic substrate, an interposer, or a substrate having through-silicon vias.

8. The molding package assembly of claim 1, wherein the first molding material comprises a first material layer formed between the first semiconductor element and the substrate and a second material layer covering the first semiconductor element and the first material layer, and the second molding material comprises a third material layer formed between the second semiconductor element and the first molding package and a fourth material layer covering the second semiconductor element and the third material layer.

9. The molding package assembly of claim 1, wherein the substrate has a rectangular periphery.

10. The molding package assembly of claim 1, wherein the first semiconductor element is a microelectromechanical system (MEMS).

11. The molding package assembly of claim 1, wherein the second semiconductor element is a microelectromechanical system (MEMS).

12. A molding material, comprising:
    a body; and
    an anti-warping structure embedded in the body, comprising:
        a ring-shaped portion formed on an edge of the body;

a grid portion formed on an inner side of the ring-shaped portion and having a frame and a plurality of bars cross each other; and a connecting portion connected to the ring-shaped portion and the grid portion;

wherein the anti-warping structure is used to prevent warping of the molding material in a molding process.

13. The molding material of claim 12, wherein the molding material comprises a first material layer and a second material layer.

14. The molding material of claim 13, wherein the first material layer has a particle size less than a particle size of the second material layer.

15. The molding material of claim 12, wherein the anti-warping structure is made of a material harder than silicon.

16. The molding material of claim 12, wherein the anti-warping structure has a rectangular periphery.

* * * * *